United States Patent
Shirane et al.

(10) Patent No.: US 7,223,483 B2
(45) Date of Patent: May 29, 2007

(54) LIGHT-EMITTING MATERIAL AND ORGANIC LIGHT-EMITTING DEVICE

(75) Inventors: Koro Shirane, Chiba (JP); Motoaki Kamachi, Chiba (JP); Naoko Ito, Chiba (JP); Tamami Koyama, Chiba (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 10/311,276

(22) PCT Filed: Feb. 20, 2002

(86) PCT No.: PCT/JP02/01475

§ 371 (c)(1),
(2), (4) Date: Dec. 17, 2002

(87) PCT Pub. No.: WO03/001615

PCT Pub. Date: Jan. 3, 2003

(65) Prior Publication Data

US 2003/0181694 A1    Sep. 25, 2003

Related U.S. Application Data

(60) Provisional application No. 60/301,845, filed on Jul. 2, 2001.

(30) Foreign Application Priority Data

Jun. 25, 2001 (JP) ............... 2001-190766

(51) Int. Cl.
*H05B 33/14* (2006.01)
*C09K 11/08* (2006.01)
*C12Q 1/68* (2006.01)

(52) U.S. Cl. ............... 428/690; 429/917; 257/E51.035; 536/23.1; 313/503; 313/504

(58) Field of Classification Search ............... 428/690, 428/917, 532; 313/506, 509, 503, 504; 536/23.1, 536/106; 257/40, E51.045; 252/301.18
See application file for complete search history.

(56) References Cited

U.S. PATENT DOCUMENTS 4,563,494 A * 1/1986 Ida .............................. 524/398

(Continued)

FOREIGN PATENT DOCUMENTS

GB    2 357 180    6/2001

(Continued)

OTHER PUBLICATIONS

J. K. Barton, et al, "Tris(phenanthroline)ruthenium(II): Stereoselectivity in Binding to DNA," *J. Am. Chem. Soc.*, vol. 106, 1984, pp. 2172-2176.

(Continued)

*Primary Examiner*—B. Hamilton Hess
*Assistant Examiner*—Camie S. Thompson
(74) *Attorney, Agent, or Firm*—Sughrue Mion, PLLC

(57) ABSTRACT

The invention relates to a light-emitting material having high emitting efficiency, high luminance and durability for use in an organic light-emitting device and to an organic electroluminescent (EL) device, in which the light-emitting material is used. The light-emitting material contains a light-emitting substance which is spatially constricted and confined in an order of two dimensions or more, thus providing a high efficient organic light-emitting device based on emission of phosphorescence from an excited triplet state.

8 Claims, 1 Drawing Sheet

U.S. PATENT DOCUMENTS

| | | | |
|---|---|---|---|
| 6,506,506 B1* | 1/2003 | Tomiuchi et al. | 428/690 |
| 2002/0043930 A1* | 4/2002 | Takeishi et al. | 313/506 |
| 2002/0126275 A1* | 9/2002 | Johnson | 356/317 |

FOREIGN PATENT DOCUMENTS

| | | |
|---|---|---|
| JP | 10-140059 A | 5/1998 |
| WO | WO 93 12256 | 6/1993 |

OTHER PUBLICATIONS

Patent Abstracts of Japan, JP 10-140059, dated May 26, 1998, Showa Denko KK.

Woolf, E.J., et al. "Effect of Cyclodextrin Solutions on Aqueous Peroxyoxalate Chemiluminescence." *Journal of Luminescence*, Nov. 1987, vol. 39, pp. 19-27.

Pauchard, M., et al. "Dye-Loaded Zeolite L Sandwiches as Artificial Antenna Systems for Light Transport." *Chemistry-A European Journal*. vol. 6, No. 18, 2000, pp. 3456-3470.

Balzani, V., et al. "Photochemistry and Photophysics of Coordination Compounds: An Extended View." *Coord. Chemistry Review*. vol. 171, 1998, pp. 3-16.

Chinese Office Action dated Dec. 8, 2006.

* cited by examiner

LIGHT-EMITTING MATERIAL AND ORGANIC LIGHT-EMITTING DEVICE

CROSS REFERENCE TO THE RELATED APPLICATIONS

This is an application based on the prescription of 35 U.S.C. Section 111(a) with claiming the benefit of filing date of U.S. Provisional application Ser. No. 60/301,845 filed Jul. 2, 2001 under the provision of 35 U.S.C.111(b), pursuant to 35 U.S.C. Section 119(e) (1).

TECHNICAL FIELD

The present invention relates to an organic light-emitting device (organic EL device or organic light-emitting diode, OLED) for flat panel displays or backlights used therein.

BACKGROUND ART

The organic light-emitting device was first reported on its high-luminance emission by C. W. Tang et al of Kodak in 1987 (see, *Appl. Phys. Lett.*, Vol. 51, page 913 (1987)). Since then, an abrupt progress has been proceeding in the development of materials and improvement of device structures and in recent years, the organic light-emitting device is actually used in a display for car audios or cellular phones. In order to more expand the use of this organic EL, development of materials for improving the emitting efficiency or durability or development of full color displays are being aggressively made at present. Particularly, on considering the use wide-spreading to the medium- or large-size panel or illumination, the high luminance must be more intensified by improving the emitting efficiency. However, the currently known light-emitting materials use light emission from the excited singlet state, namely, fluorescence, and according to *Monthly Display*, "Organic EL Display", extra number, page 58 (October, 1988), the generation ratio of the excited singlet state to the excited triplet state upon electric excitation is 1:3. Therefore, the internal quantum efficiency in the fluorescence emission in an organic EL device has been acknowledged to have an upper limit of 25%.

On the other hand, M. A. Baldo et al. have reported that an external quantum efficiency of 7.5% (assuming that the external couple out efficiency is 20%, the internal quantum efficiency is 37.5%) can be obtained by using an iridium complex capable of emitting phosphorescence from the excited triplet state and thus, the conventionally acknowledged upper limit of 25% can be surpassed (see, *Appl. Phys. Lett.*, Vol. 75, page 4 (1999)). However, such a material that is capable of stably emitting phosphorescence at room temperature like the iridium complex used there is very rare so that freedom in selecting a material is narrow, and on practical use, the material must be disadvantageously doped into a specific host compound. As a result, great difficulties are encountered in selecting a material for satisfying the specification necessary for displays.

Furthermore, the same M. A. Baldo et al. have reported that relatively good emitting efficiency can be obtained by using an iridium complex as a sensitizer, transferring the energy from the excited triplet state of this complex to the excited singlet state of a fluorescent dye, and finally emitting fluorescence from the excited singlet state of the fluorescent dye (see, *Nature*, Vol. 403, page 750 (2000)). This method is advantageous in that a light-emitting material well matching the purpose can be selected from a large number of fluorescent dyes. However, this method has a serious problem that it involves energy transfer from the excited triplet state of a sensitizer to the excited singlet state of a fluorescent dye, which is a spin-forbidding process, so that the emission quantum efficiency is low in principle.

As such, existing light-emitting materials for use in an organic light-emitting device cannot succeed in surpassing the conventionally acknowledged marginal value of 25% in the internal quantum efficiency and being applicable to all emission colors considered necessary for a display. That is, a material system other than the transient metal complex such as iridium that emits phosphorescence at room temperature and provides freedom of selecting an emission color has been demanded. A material having high emitting efficiency is demanded also from the standpoint of improving the durability of the device because such a material causes little energy loss and the device can be prevented from heat generation. An object of the present invention is to solve those problems in conventional techniques and provide a high-luminance organic light-emitting device having durability and a light-emitting material for use in the device.

DISCLOSURE OF THE INVENTION

As a result of extensive investigations to solve the above-described problems, the present inventors have found that by spatially constricting and confining a light-emitting substance in an order of two or more dimensions on the level of molecule, high-efficiency light emission based on the emission of phosphorescence from an excited triplet state can be achieved. The present invention has been accomplished based on this finding.

That is, the present invention relates to the following light-emitting materials and to organic light-emitting devices.

1. A light-emitting material comprising a light-emitting substance spatially constricted and confined in an order of two or more dimensions on the level of molecule.
2. The light-emitting material as described in 1 above, wherein light emission from the light-emitting substance is light emission from an excited triplet state or light emission through an excited triplet state.
3. The light-emitting material as described in 1 or 2 above, wherein the light-emitting material is provided with a space defined by a nucleic acid having a helix structure or its derivatives for constricting and confining the light-emitting substance therein.
4. The light-emitting material as described in 1 or 2 above, wherein the light-emitting material is provided with a space defined by a host compound that is capable of forming a inclusion compound with the light-emitting substance for constricting and confining the light-emitting substance therein.
5. The light-emitting material as described in 4 above, wherein the host compound is cyclodextrin or its derivative.
6. An organic light-emitting device comprising a light-emitting layer containing a light-emitting substance which is spatially constricted and confined in an order of two or more dimensions on the level of molecule.
7. The organic light-emitting device as described in 6 above, wherein light emission from the light-emitting substance is light emission from an excited triplet state or light emission through an excited triplet state.
8. The organic light-emitting device as described in 6 or 7 above, wherein the light-emitting material is provided with a space defined by a nucleic acid having a helix structure or its derivatives for constricting and confining the light-emitting substance therein.
9. The organic light-emitting device as described in 6 or 7 above, wherein the light-emitting material is provided with a space defined by a host compound that is capable of forming a inclusion compound with the light-emitting substance for constricting and confining the light-emitting substance therein.
10. The organic light-emitting device as described in 9 above, wherein the host compound is cyclodextrin or its derivative.

MODE FOR CARRYING OUT THE INVENTION

Figure 1:
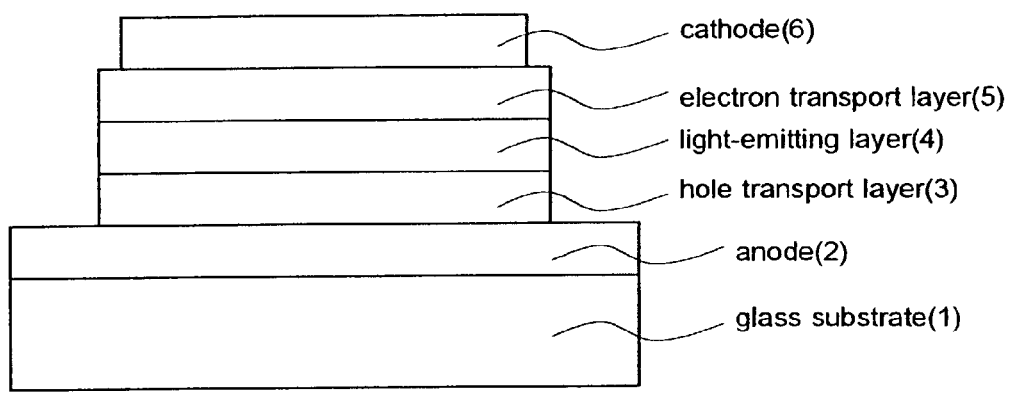
FIG. 1 is a cross-sectional view showing an example of the organic light-emitting device of the present invention.

The operation mode of the present invention is specifically described below by referring to the drawings attached hereto.

FIG. 1 is a cross-sectional view showing one example of the structure of the organic light-emitting device according to the present invention, where a hole transport layer (3), a light-emitting layer (4) containing the light-emitting material of the present invention and an electron transport layer (5) are provided in this order between an anode (2) provided on a transparent substrate (1) and a cathode (6). The organic light-emitting device structure is not limited to this example shown in FIG. 1 but either one of 1) a hole transport layer/a light-emitting layer and 2) a light-emitting layer/an electron transport layer may be provided in this order or only one of 3) a layer containing a hole transport material, a light-emitting material and an electron transport material, 4) a layer containing a hole transport material and a light-emitting material, 5) a layer containing a light-emitting material and an electron transport material, and 6) a layer containing only a light-emitting material may be provided. The light-emitting layer shown in FIG. 1 comprises one layer but may comprise a laminate of two or more layers.

In the organic light-emitting device of the present invention, a light-emitting material that spatially constricts and confines a light-emitting substance in an order of two or more dimensions on the level of molecule is used.

Here, explanation will be made on the order of dimension for confining the light-emitting material of the present invention.

Three-dimensional constriction or confinement means confinement in a space where the light-emitting molecule is not allowed to freely move in all the directions of X, Y and Z. For example, this is the case where the sizes of the space in which the light-emitting substance is confined in the X, Y and Z directions are of the same levels as those of the light-emitting molecule in the X, Y and Z directions. Next, two-dimensional constriction or confinement means confinement in a space in which the light-emitting molecule is not allowed to move in two directions out of the three directions of X, Y and Z. For example, this is the case of confinement in a tubular hole where the sizes of the space in which the light-emitting substance is confined in the X and Y directions are of the same levels as those of the light-emitting molecule in the X and Y directions and the Z direction is open for the movement. Although it is not an objective of the present invention, one-dimensional confinement will be explained. This means confinement in a space where the light-emitting molecule is not allowed to move only in one direction out of the three directions of X, Y and Z. For example, this is the case of confinement in a layer-like space with an interval of the same level as the size of the light-emitting molecule in one direction.

The compound that provides such a space for confining the light-emitting molecule may include nucleic acid or derivatives thereof having a helix structure, host compound that can form a inclusion compound with the light-emitting compound (guest compound) and so forth. However, the present invention is by no means limited thereto.

Hereinafter, explanation will be made on nucleic acid or its derivatives having a helix structure, a first example of the compound for constricting and confining the light-emitting molecule used in the organic light-emitting device of the present invention.

A nucleic acid having a helix structure is a twisted structure consisting of two or more chain polymers each comprising nucleotide units composed of a sugar, phosphoric acid and abase. Here, the sugar used is deoxyribose or ribose and the base used are two or four of five species, i.e., adenine, thymine, guanine, cytosine and uracil (or their derivatives). In the case where the sugar is deoxyribose and the bases are adenine guanine cytosine and thymine, the nucleic acid is DNA (deoxyribonucleic acid). On the other hand, in the case where the sugar is ribose and the bases are adenine, guanine, cytosine and uracil, the nucleic acid is RNA (ribonucleic acid). The nucleic acid having a helix structure used in the organic light-emitting device of the present invention is typically DNA of a double stranded structure composed of two polynucleotide chains helically twisted. In this case, the two chains constituting the double strand are by no means limited to DNA. That is, the both of two chains may be of RNA or one chain is of DNA and another is of RNA. Furthermore, each polynucleotide chain constituting the double strand is not always of DNA or RNA; as described above, the sugar may be either deoxyribose or ribose and the base may be any two or four species out of the five species of adenine, thymine, guanine, cytosine and uracil (or their derivatives). However, the two polynucleotide chains are bonded through hydrogen bonds between the bases of the respective chains with each other and the combinations of bases bonded are limited to the combinations of adenine and thymine (or uracil), and guanine and cytosine. DNA includes combinations of bases of adenine and thymine, and guanine and cytosine while RNA includes combinations of bases of adenine and uracil, and guanine and cytosine. Besides nucleic acids derived from natural living organisms, artificially synthesized nucleic acids can be used. In this case, the bases must be selected from the above-mentioned units of combination. Therefore, examples of combinations providing a double stranded structure includes a combination of a polydeoxyadenylic acid homopolymer chain and a polydeoxythimidylic acid homopolymer chain, a combination of copolymer chain composed of deoxyadenylic acid units and deoxythymidylic acid units, and a copolymer chain composed of same units wherein the base form pairs with the bases in the former copolymer chain, etc. However, the present invention is by no means limited thereto.

DNA is a polymer having two polynucleotide chains forming a double stranded structure, which is generally in the form of sodium salt and hence water-soluble. The inside of the double stranded structure assumes a layer structure in which aromatic heterocyclic compounds in the bases are stacked in parallel. Between the layers, various compounds can be interposed (intercalated). As the light-emitting molecule that is intercalated, there are known ethidium, 9-aminocoumarine, acridine orange, proflavin, erybutidine, 3,5,6,8-tetramethyl-N-methylphenanthrolinium, and 2-hydroxyethane thiolate-2,2',2"-terpyridine platinum (II), and in addition laser dyes such as coumarin and derivatives of coumarin, fluorescein and derivatives of fluorescein, rhodamine and derivatives of rhodamine, oxazine perchlorate and derivatives thereof, 3,3'-diethylthiadicarbocyanine iodide, and 3,3'-diethylthiatricarbocyanine perchlorate, transition metal complexes such as tris(phenanthroline) ruthenium (II) complex, and so forth. However, the present invention is by no means limited thereto.

In the case where the light-emitting molecule is intercalated in DNA as described above, the light-emitting molecule is interposed between the layers formed by a stack of bases. In this case, the light-emitting molecule is constricted in the direction perpendicular to the plane of base layer and at the same time one dimension out of two-dimensional freedom in the base layer is also constricted, so that the order of constriction is two dimensions. That is, the freedom exists in only one dimension in the direction in which intercalation is performed. In the case where a light-emitting molecule of a nonplanar structure having a plurality of planar ligands, such as tris(phenanthroline) ruthenium (II) complex, it is considered according to J. Am. Chem. Soc., Vol. 106, p. 2172 (1984) that only one ligand is intercalated between the layers of bases and the other two ligands are seated in the groove of double helix. In this case, the freedom of light-emitting molecule as follows. That is, since one side is constricted also in the direction of intercalation, the order of constriction is two dimensions or more and the freedom is one dimension or less.

Furthermore, nucleic acid derivatives may be used for the organic light-emitting device of the present invention as far as the helix structure is retained. Hereafter, one example of the nucleic acid derivative is shown. However, the present invention is by no means limited thereto. One example of the nucleic acid derivative can be obtained by utilizing the property of DNA such that its negatively charged phosphate group moiety quickly forms a salt with positively charged quaternary ammonium (J. Am. Chem. Soc., Vol. 118, p. 10679, 1996).

The molecular weight of DNA is not particularly limited. However, it is preferably 6,000 to 20,000,000 and more preferably 10,000 to 100,000. The quaternary ammonium is preferably a surfactant represented by general formula (1)

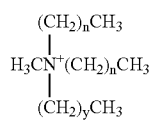

(1)

wherein m, n and y are independently 0 or an integer of 1 to 20. Although the general formula (1) is exemplified above, basically any quaternary ammonium salt having a hydrophobic functional group may be used for preparing DNA derivatives for use in the organic light-emitting device of the present invention.

Also, a surfactant having polyethylene glycol represented by general formula (2) below may be used as the quaternary ammonium. This is suitable in imparting flexibility to the DNA derivative film and adding thereto a property to well resist the occurrence of cracks accompanied by the bending of the device.

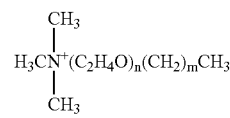

wherein n and m are independently 0 or an integer of 1 to 20.

Furthermore, a surfactant having an aromatic group represented by general formula (3) below may be used as the quaternary ammonium. This is suitable for imparting rigidity to the DNA derivative film and also imparts thereto an ability of preventing the occurrence of cracks due to pressure or compression.

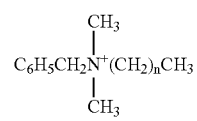

wherein n is 0 or an integer of 1 to 30.

In the above structural formulae containing an aromatic ring, the species of aromatic ring is not questioned and a pyridine derivative as represented by general formula (4) may also be used.

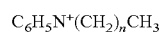

wherein n is 0 or an integer of 1 to 20.

In addition, the quaternary ammonium containing a hydrophobic group for derivatizing DNA may be a functional molecule having a light-emitting function. In spite of the above exemplification, the functional group for forming an ionic bond with the phosphate group moiety is not limited to quaternary ammonium and it is not particularly limited as far as it has positive charge sufficiently strong affinity for the negative charge of the phosphate group.

The intercalation of the light-emitting molecule into the nucleic acid derivatives as described above can be performed by dipping the nucleic acid or nucleic acid derivative in a solution containing the light-emitting molecule. Also, the intercalation of the light-emitting molecule into the nucleic acid derivative may be performed by intercalating the light-emitting molecule into a non-derivatized nucleic acid and then derivatizing the intercalated product. Furthermore, the quaternary ammonium salt containing a hydrophobic group for derivatizing nucleic acid may in itself be a light-emitting molecule.

The above-mentioned nucleic derivative may be formed into a film by solution coating or melting. That is, a solution of the nucleic acid derivative in a proper solvent such as ethanol, chloroform, or methyl ethyl ketone may be spread on a substrate by spin coating or casting as generally used for photoresist treatment in semiconductor industries to form a thin film. The solvent used in this step is not particularly limited as far as a proper solution of the nucleic acid derivative can be obtained. Also, the characteristics of film may be controlled by further applying heat, magnetic field, electric field or the like to the nucleic acid derivative film formed on the substrate thereby controlling the orientation of the nucleic acid derivative. Furthermore, a nucleic acid derivative thin film previously cast on a substrate may be peeled off and bonded onto another substrate by heating or such a nucleic acid derivative thin film may be drawn and bonded to another substrate.

Hereinafter, explanation will be made on the host compound that constitutes a inclusion compound with a light-emitting molecule, which is a second example of the compound for providing a space for constricting and confining the light-emitting compound in the organic light-emitting device of the present invention.

The host compound that constitutes a inclusion compound in a pair with a light-emitting molecule which is a guest compound includes various compounds which can be classified depending on the shape of space in which the guest compound is confined into 1) tubular or annular compounds, 2) cage-shaped compound, and so forth. However, the present invention is by no means limited thereto.

The host compound providing a tubular or annular space for confining a guest compound therein includes, for example, cyclodextrin, annular cyclophane, calixarene, calixresorcarene, and crown ether for a single-molecular system that can intercalate therein the guest molecule by a single molecule. For a multi-molecular system in which a plurality of molecules gathers for intercalating the guest compound, urea, thiourea and so forth may be exemplified. In a polymer system, cellulose, amylose and the like may be exemplified. However, the present invention is by no means limited thereto. These host compounds confine the guest compound two-dimensionally, having a freedom in one dimension only in the direction in which a hole is open.

The host compound providing a cage-shaped space for a confining guest compound therein includes, for example, cage-shaped cyclophane, cryptand and so forth for a single-molecular system. For a multi-molecular system such a host compound includes, for example, dicyanoamine nickel, and tri-o-thymotide. Inorganic substances such as zeolite and porous glass may be also used. However, the present invention is by no means limited thereto. These host compounds constrict and confine the guest compound in an order between 2 dimensions and 3 dimensions. In this case, the freedom of confinement is of an order between 0 dimension and 1 dimension. The above-mentioned single-molecular system, two or more host compounds may intercalate one guest molecule. In this case, the two or more host compounds may be chemically bonded to each other.

As the host compound that forms a inclusion compound in the present invention, typically cyclodextrin or cyclodextrin derivatives may be used. Specific examples of such a compound include unmodified cyclodextrins such as α-cyclodextrin, β-cyclodextrin, and γ-cyclodextrin, hydrophilic derivatives thereof such as methylated β-cyclodextrin, hydroxylated β-cyclodextrin, and glucosyl β-cyclodextrin, hydrophobic derivatives thereof such as alkylated β-cyclodextrin, and acylated β-cyclodextrin, and so forth. The host compound may consist of a plurality of such cyclodextrins chemically bonded to each other.

In the organic light-emitting device of the present invention, the space in which the light-emitting molecule is constricted and confined is preferably hydrophobic. The inside of the double helix of DNA is of a structure such that the aromatic rings of bases are stacked and thus is hydrophobic. As for the inclusion compounds, cyclodextrin, cyclophane, calixarene and so forth provide a cavity whose inside is hydrophobic. Although compounds providing hydrophobic space for confining the light-emitting molecule are exemplified above, the present invention is by no means limited thereto.

Also, as the compound for providing a space for constricting and confining the light-emitting molecule in the organic EL device of the present invention, any one of low molecular compounds, high molecular compounds or oligomer compounds may be used. The high molecular compound includes, for example, high molecular compounds having cyclodextrin in the main chain or side chain thereof and so forth as well as the nucleic acids and nucleic acid derivatives as exemplified above. However, the present invention is by no means limited thereto.

As the light-emitting substance (light-emitting molecule) used in the light-emitting layer in the organic light-emitting device of the present invention, both of a substance that emits fluorescence or a substance that emits phosphorescence may be used. More preferred is a substance that emits phosphorescence from an excited triplet state or a substance that emits light through an excited triplet state. These light-emitting substances have a quantum efficiency of preferably 0.1 or more, more preferably 0.3 or more, and still more preferably 0.5 or more. Specific examples of the compound having such high quantum efficiency may be selected, for example, by consulting "Handbook of Photochemistry", Second Edition (Steven L. Murov et al., Marcel Dekker Inc., 1993).

Specific examples of the substance that emits phosphorescence from an excited triplet state include transient metal complexes, benzophenone, 4-methylbenzoic acid, dibenzothiophene, 1-bromonaphthalene and so forth. However, the present invention is by no means limited thereto.

The transient metal used in the transient metal complexes include from Sc with an atomic number of 21 to Zn with an atomic number of 30 in the first transient element series, from Y with an atomic number of 39 to Cd with an atomic number of 48 in the second transient element series, and from Hf with an atomic number of 72 to Hg with an atomic number of 80 in the third transient element series, respectively, in the periodic table.

Specific examples of the substance that emits light through an excited triplet state include rare earth metal complexes. However, the present invention is by no means limited thereto. The rare earth metals used in the rare earth metal complexes include from La with an atomic number of 57 to Lu with an atomic number of 71.

Examples of the ligand used in the transition metal complex or rare earth metal complex include acetylacetonato, 2,2'-bipyridine, 4,4'-dimethyl-2,2'-bipyridine, 1,10-phenanthroline, 2-phenylpyridine, porphyrin and phthalocyanine. However, the present invention is by no means limited thereto. A kind of these ligands or kinds of these ligands is (are) coordinated to one complex. The above-described complex compound may also be a polynuclear complex or a composite complex of two or more complexes.

The mechanism of light emission in the organic light-emitting device of the present invention is as follows. That is, by electric excitation, there are generated the lowest excited singlet state and the lowest excited triplet state in a ratio of 25%:75%. In the case of transient metal complex or rare earth metal complex, intersystem crossing from the lowest excited singlet state to the lowest excited triplet state tends to occur due to a heavy atom effect and hence the ratio of the lowest triplet state increases to 75% or more. In the case of transient metal complexes and benzophenone that emit phosphorescence from the lowest excited triplet state, there exists radiation-less transition as well as radiation transition emitting phosphorescence. Further, in the case of rare earth metal complexes, the excitation energy of the lowest excited triplet state of a ligand shifts to the central metal ion and light emission occurs from the excited level of the central metal ion. In this case too, there exists radiation-less transition as well as radiation transition of emission. These radiation-less transitions cannot be prevented unless a very low temperature is reached and usually light emission of the above-mentioned compound at room temperature is extremely weak.

However, the organic light-emitting device of the present invention, the light-emitting substance is spatially constricted and confined on a molecular level to prevent the structural change of the molecule in an excited state; therefore, Franck-Condon factor between the oscillation level of the ground state and that of the excited state is decreased so that radiation-less transient due to relaxation to the oscillation level becomes harder to occur. Further, the excited triplet state is inactivated with oxygen. However, the organic light-emitting device of the present invention is less susceptible to optical quenching with oxygen because of confinement of the light-emitting molecule. Furthermore, by rendering the space in which the light-emitting molecule is confined hydrophobic, the light-emitting molecule is inaccessible to oxygen dissolved in water and as a result no inactivation of excited triplet state occurs. By these effects, radiation-less transition is prevented and therefore emission of phosphorescence from the excited triplet state or light emission through the excited triplet state can occur efficiently.

As the hole transport material for forming the hole transport layer of the organic light-emitting device according to the present invention, a triphenylamine derivative such as TPD (N,N'-diphenyl-N,N'-(3-methylphenyl)-1,1'-biphenyl-4,4'-diamine), α-NPD (N,N'-diphenyl-N,N'-(1-naphthyl)-1,1'-biphenyl-4,4'-diamine) or m-MTDATA(4,4', 4"-tris-[N-(3-methylphenyl)-N-phenylamino] triphenylamine), or a known hole transport material such as polyvinyl carbazole and polyethylene dioxythiophene may be used. However, the present invention is by no means limited thereto. These hole transport materials may be used individually or may be used by mixing or laminating it with a different hole transport material. The thickness of the hole transport layer varies depending on the electric conductivity of the hole transport layer and cannot be indiscriminately specified but it is preferably from 10 nm to 10 μm, more preferably from 10 nm to 1 μm.

As the electron transport material for forming the electron transport layer of the organic light-emitting device according to the present invention, a quinolinol derivative metal complex such as Alq$_3$ (tris (8-quinolinol) aluminum), or a known electron transport material such as an oxadiazole derivative and a triazole derivative, may be used. However, the present invention is by no means limited thereto. These electron transfer materials may be used individually or may be used by mixing or laminating it with a different electron transfer material. The thickness of the electron transfer layer varies depending on the electric conductivity of the electron transport layer and cannot be indiscriminately specified but it is preferably from 10 nm to 10 μm, more preferably from 10 nm to 1 μm.

The organic compound for use in the light-emitting layer, the hole transport material and the electron transport material each may form respective layers by itself or using a polymer material as the binder. Examples of the polymer material, which can be used for this purpose, include polymethyl methacrylate, polycarbonate, polyester, polysulfone, and polyphenylene oxide. However, the present invention is by not means limited thereto.

The organic compound for use in the light-emitting layer, the hole transport material and the electron transport material each maybe formed into a film by a resistance heating vacuum evaporation, an electron beam vacuum evaporation method, a sputtering method or a coating method. However, the present invention is by no means limited to these methods. In the case of a low molecular compound, resistance heating vacuum evaporation or electron beam vacuum evaporation is predominantly used, and in the case of a high molecular material, a coating method is predominantly used.

For the anode material of the organic light-emitting device according to the present invention, known transparent electrically conducting materials may be used, such as ITO (indium tin oxide), tin oxide, zinc oxide, and conductive polymers such as polythiophene, polypyrrole and polyaniline. However, the present invention is by no means limited thereto. The electrode formed of this transparent electrically conducting material preferably has a surface resistance of from 1 to 50 ohm per square. The anode material may be formed into a film by an electron beam vacuum evaporation method, a sputtering method, a chemical reaction method or a coating method. However, the present invention is by no means limited to these methods. The anode preferably has a thickness of from 50 to 300 nm.

Between the anode and the hole transport layer or the organic layer laminated adjacently to the anode, a buffer layer may be interposed for the purpose of relaxing the injection barrier against the hole injection. For this purpose, known materials such as copper phthalocyanine may be used. However, the present invention is by no means limited thereto.

For the cathode material of the organic light-emitting device according to the present invention, known cathode materials may be used and examples thereof include Al, MgAg alloy, alkali metals such as Ca, and Al-alkali metal alloys such as AlCa. However, the present invention is by no means limited thereto. The cathode material may be formed into a film using a resistance heating vacuum evaporation method, an electron bean vacuum evaporation method, a sputtering method or an ion plating method. However, the present invention is by no means limited thereto. The cathode preferably has a thickness of from 10 nm to 1 μm, more preferably from 50 to 500 nm.

Between the cathode and the electron transport layer or the organic layer laminated adjacently to the cathode, an insulating layer having a thickness of from 0.1 to 10 nm may be interposed so as to improve the electron injection efficiency. For the insulating layer, known materials such as lithium fluoride, magnesium fluoride, magnesium oxide and alumina may be used. However, the present invention is by no means limited thereto.

In the adjacency to the cathode side of the light-emitting layer, a hole blocking layer may be provided so as to prevent holes from passing through the light-emitting layer but efficiently recombine the holes with electrons within the light-emitting layer. For this purpose, known materials such as a triazole derivative, an oxadiazole derivative and a phenanthroline derivative may be used. However, the present invention is by no means limited thereto.

For the substrate of the organic light-emitting device according to the present invention, an insulating substrate transparent to the light-emission wavelength of the light-emitting material may be used and examples thereof include glass and known materials such as transparent plastics including PET (polyethylene terephthalate) and polycarbonate. However, the present invention is by no means limited thereto.

Matrix type or segment type pixels can be fabricated by a known method in the organic light-emitting device of the present invention, or the light-emitting device may be used as a backlight without forming pixels.

BEST MODE FOR CARRYING OUT THE INVENTION

Hereinafter, the present invention will be described in detail by examples and comparative examples. However, the present invention is by no means limited thereby.

The measurement items and measuring method in the examples and comparative examples are as follows.

<Thickness>

The thickness of organic layers was measured using DEKTAK 3030 (a stylus type profilometer) produced by SLOAN Co.

<Emitting Luminance>

As the power source, a programmable direct current voltage/current source TR6143 produced by Advantest Co. Ltd. was used to apply voltage to the organic light-emitting devices obtained in the examples and comparative examples. The emitting luminance was measured using a luminance meter BM-8 produced by Topcon Co., Ltd.

<Emission Lifetime>

Pulse laser beam was irradiated on the glass substrate side (ITO electrode side) of each organic light-emitting device obtained in Examples and attenuation of the emitting luminance was measured by use of the following apparatuses and evaluation of emission lifetime was performed.

Laser for excitation: YAG laser sure-lite II (produced by Continuum E. O. Inc.), wavelength: 355 nm.

CCD detector: ICCD-MAX512T (produced by Roper Scientific, Inc.) Spectrometer: ARC306 Model (produced by Roper Scientific, Inc.) Controller for time-resolved measurement: FOUR CHANNEL DIGITAL DELAY/PULSE GENERATOR (produced by Stanford Research Systems, Inc.)

EXAMPLE 1

Using lipidified DNA having intercalated therein a ruthenium complex for a light-emitting layer, an organic EL device was fabricated as described below and its light emission property was evaluated.

(1) Synthesis of Lipidified DNA 0.5 g of DNA-Na (produced by Yuki Gosei Yakuhin Co., Ltd.) was dissolved in 200 ml of purified water to prepare a solution (solution A). Also 0.8 g of dilauryldimethylammonium bromide was dissolved in 100 ml of purified water to prepare a solution (solution B). Then the solution A was dripped to the solution A over 15 minutes while stirring. Precipitates, which formed, were left to stand and the supernatant was decanted. Further, water washing-decantation was repeated. After separating the solid component, vacuum drying was performed at 40° C. for one day to obtain lipidified DNA (DNA-$2C_{12}$) as powder.

(2) Synthesis of tris(1,10-phenanthroline) Ruthenium Salt

According to a known method (C-T. Lin et al., Journal of the American Chemical Society, Vol. 91, No. 21, p. 6536, 1976), tris(1,10-phenanthroline) ruthenium (II) dichloride was synthesized.

(3) Intercalation of a Dye into DNA Derivative 127.9 mg of DNA-$2C_{12}$ obtained in (1) above was dissolved in 20 ml of ethanol and the solution was stirred at 25° C. for 1 hour. To this was added a solution of 3.56 mg of tris(1,10-phenanthroline) ruthenium (II) dichloride dissolved in 1 ml of ethanol, and further 10 ml of ethanol was added thereto, followed by stirring at 25° C. for 1 hour. After completion of the reaction, the solvent was distilled off by use of a rotary vacuum evaporator and further the solvent was removed at 25° C. for 3 hours by vacuum drying. The obtained powder was dissolved in 10 ml of chloroform and the solution was poured into 200 ml of hexane for recrystallization. After recovering solid component by filtration, the solid was washed with hexane and subjected to vacuum drying at 40° C. for 12 hours to obtain target DNA-$2C_{12}$ having intercalated therein tris(1,10-phenanthroline) ruthenium (II) dichloride (DNA-$2C_{12}$—Ru) as yellow powder.

(4) Fabrication of Organic EL Device

An organic EL device was fabricated using an ITO-precoated substrate which had two stripes of ITO electrodes of 4 mm in width on one side of a 25 mm-square glass substrate.

First, a coating solution for forming a layer containing a hole transport material, a light-emitting material, and an electron transport material was prepared. The light-emitting emitting material, hole transport material, electron transport material and solvent were mixed in compounding ratios shown in Table 1 and the obtained solution was filtered through a filter with an aperture diameter of 0.5 μm to obtain a coating solution. Each of the materials, synthesized preparations by the inventors or purchased preparations, was used without further purification.

Light-emitting material:
DNA-$2C_{12}$—Ru (product synthesized in (3) above)

Hole transport material:
Poly(N-vinylcarbazole) (produced by Tokyo Kasei Co.)

Electron transport material:
2-(4-Biphenyl)-5-(4-tert-butylphenyl)-1,3, 4-oxa-diazole(PBD) (produced by Tokyo Kasei, Co.)

Solvent: Chloroform (produced by Wako Pure Chemical Industry Co., special grade)

TABLE 1

| | | Compounding Amount (mg) |
|---|---|---|
| Light Emitting Material | DNA-$2C_{12}$-Ru | 18 |
| Hole Transport material | Poly(N-vinylcarbazole) | 24 |
| Electron Transport Material | PED | 18 |
| Solvent | Chloroform | 5,940 |

Then, the prepared coating solution was coated on the ITO-precoated glass substrate by a spin coating method under the conditions of 3,000 rpm and a coating time of 30 seconds and dried at room temperature at 25° C. for 30 minutes to form a layer containing the hole transport material, light-emitting material, and electron transport material. The obtained layer containing the hole transport material, light-emitting material, and electron transport material had a thickness of about 800 nm.

Then, the substrate on which the layer containing the hole transport material, light-emitting material, and electron transport material was formed was placed in a vacuum evaporation apparatus, and silver and magnesium were co-deposited in weight ratios of 1:10 to form two cathodes of 3 mm in width arranged in the form of a stripe in the direction perpendicular to the direction in which the two stripe-shaped anodes (ITO) extended. The obtained cathode had a thickness of about 50 nm.

Finally, in argon atmosphere, lead wires were attached to the anode and cathode to fabricate 4 organic EL devices of a size of 4 mm long×3 mm wide.

(5) Evaluation of Light Emission Property

To the organic EL devices described above was applied voltage and as a result reddish orange light emission known as phosphorescence emission of tris(1,10-phenanthroline) ruthenium (II) complex (C-T. Lin et al.: J. Am. Chem. Soc., Vol. 98, No. 21, p. 6536 (1976)) was observed. The light-emitting luminance measured was 1.2 cd/m$^2$ when a voltage of 15 V was applied. The emission lifetime obtained as time until which the emitting luminance was attenuated to 1/e was 5 µsec. This indicates that the light emission obtained by this organic light-emitting device was phosphorescence emission.

COMPARATIVE EXAMPLE 1

Organic EL devices were fabricated by using tris(1,10-phenanthroline) ruthenium (II) dichloride not intercalated in DNA but directly added in the light-emitting layer in the manner described below and their light emission property was evaluated. The ruthenium complex salt used here electrochemically emits light in the case where migration of ions is possible but here in order to make comparison under the same current injection type organic EL light emission as in Example 1, the device was constructed so as to have a layer blocking migration of ions (corresponding to poly(N-vinylcarbazole) layer) interposed between the light-emitting layer and the electrode.

(1) Fabrication of Organic EL Device

An organic EL device was fabricated using the same ITO-precoated glass substrate as in Example 1 and a hole transport layer was formed thereon. More particularly, a solution of 10 mg of poly(N-vinylcarbazole) (produced by Tokyo Kasei Co.) dissolved in 1,990 mg of chloroform (produced by Wako Pure Chemical Industry Co., special grade) was filtered through a filter with an aperture diameter of 0.2 µm to obtain a coating solution. This solution was coated on ITO-precoated glass substrate by a spin coating method under the conditions of 3,000 rpm and a coating time of 30 seconds and dried at room temperature (25° C.) for 30 minutes to form a hole transport layer. The thickness of hole transport layer was about 50 nm.

Subsequently, a coating solution for forming a layer containing a light-emitting material, and an electron transport material was prepared. The light-emitting material, electron transport material and solvent were mixed in compounding ratios shown in Table 2 and the obtained solution was filtered through a filter with an aperture diameter of 0.2 µm to obtain a coating solution. Each of the materials, synthesized preparations by the inventors or purchased preparations, was used without further purification.

Light-emitting material:
    Tris(1,10-phenanthroline) ruthenium (II) dichloride (the above-described synthetic product)
Electron transport material:
    2-(4-Biphenyl)-5-(4-tert-butylphenyl)-1,3,4-oxadiazole(PBD) (produced by Tokyo Kasei, Co.)
Solvent: Acetone (produced by Wako Pure Chemical Industry Co., special grade)

TABLE 2

| Light Emitting Material | Tris (1,10-phenanthroline) ruthenium (II) dichloride | Compounding Amount (mg) 40 |
|---|---|---|
| Electron Transport Material | PBD | 40 |
| Solvent | Acetone | 4,920 |

Then, the prepared coating solution was coated on the hole transport layer by a spin coating method under the conditions of 3,000 rpm and a coating time of 30 seconds and dried under vacuum at room temperature at 40° C. for 1 hour to form a layer containing the light-emitting material and electron transport material. The obtained layer containing the light-emitting material and electron transport material had a thickness of about 50 nm.

Then, the substrate on which the layer containing the light-emitting material and electron transport material was formed was placed in a vacuum evaporation apparatus, and formation of cathode and attachment of a lead wire were performed in the same manner as in Example 1 to fabricate an organic EL device.

(2) Evaluation of Light Emission Property

To the organic EL devices described above was applied voltage, and current density and light-emitting luminance were measured. As a result, an extremely weak red light emission was observed with naked eye and a light emitting luminance less than 0.1 cd/m$^2$ was obtained when a voltage of 15 V was applied.

EXAMPLE 2

Organic EL devices were fabricated using cyclodextrin having intercalated therein a naphthalene derivative for the light-emitting layer as described below and their light emission property was evaluated.

(1) Preparation of Solution of Cyclodextrin-Intercalated Composite 195 mg of glucosyl-β-cyclodextrin (produced by Tokyo Kasei Co., Ltd.) was dissolved in 5 ml of purified water. To this were added 6 µl of 1-bromonaphthalene (produced by Tokyo Kasei Co., Ltd.) and 450 µl of tertiary-butanol (produced by Tokyo Kasei Co.), followed by mixing by applying ultrasonic wave over 30 minutes to obtain a transparent solution (solution C).

(2) Fabrication of Organic EL Device

Using the same ITO-precoated glass substrate as in Example 1, a hole transport layer was formed thereon. More particularly, a solution of 10 mg of poly(N-vinylcarbazole) (produced by Tokyo Kasei Co.) dissolved in 1,990 mg of chloroform (produced by Wako Pure Chemical Industry Co., special grade) was filtered through a filter with an aperture diameter of 0.2 µm to obtain a coating solution. This solution was coated on the ITO-precoated glass substrate by a spin coating method under the conditions of 3,000 rpm and a coating time of 30 seconds and dried at room temperature (25° C.) for 30 minutes to form a hole transport layer. The thickness of hole transport layer was about 50 nm.

Then, a layer containing the light-emitting material and a binder polymer was formed as described below. That is, 10 mg of poly(N,N-dimethylaminopropylacrylamide) (PDMA-PAA) synthesized according to the method disclosed in JP-A-10-140059 (here, the term "JP-A" means Unexamined Published Japanese Patent Application (Kokai)) was dissolved in 2 g of solution C and the solution was filtered through a filter with an aperture diameter of 0.2 μm to obtain solution D.

Then, the solution D was coated on the hole transport layer by a spin coating method under the conditions of 3,000 rpm and a coating time of 30 seconds and dried under vacuum at 60° C. for 3 hours to form a layer containing the light-emitting material. The obtained layer containing the light-emitting material had a thickness of about 50 nm.

Subsequently, the substrate on which the layer containing the light-emitting material was formed was placed in a vacuum evaporation apparatus, and 3-(4-biphenylyl)-4-phenyl-5-(4-tertiarybutylphenyl)-1,2,4-triazole (TAZ, produced by Dojin Chemical Laboratories) was evaporated on at a rate of about 0.1 nm/sec to about 50 nm.

Then, formation of cathode and attachment of a lead wire were performed in the same manner as in Example 1 to fabricate an organic EL device.

(3) Evaluation of Light Emission Property

To the organic EL devices described above was applied voltage, and current density and light-emitting luminance were measured. As a result, bluish green light emission known as phosphorescence emission of 1-bromonaphthalene (G. N. Lewis and M. Kasha: J. Am. Chem. Soc., Vol. 66, p. 2100 (1944)) was observed. The light-emitting luminance measured was 2.7 cd/m$^2$ when a voltage of 15 V was applied. The emission lifetime obtained as time until which the emitting luminance was attenuated to 1/e was 4 msec. This indicates that the light emission obtained by this organic light-emitting device was phosphorescence emission.

COMPARATIVE EXAMPLE 2

Organic EL devices were fabricated by using 1-bromonaphthalene not intercalated in glucosyl-β-cyclodextrin but directly added in the light-emitting layer in the manner described below and their emitting luminance was evaluated.

(1) Fabrication of EL Device

An organic EL device was fabricated using the same ITO-precoated glass substrate and a hole transport layer was formed thereon as in Example 2. Then, a coating solution for forming a layer containing the light emitting material was prepared. More particularly, the light-emitting material, a binder polymer and solvent shown in Table 3 were mixed in compounding ratios shown in Table 3 and the obtained solution was filtered through a filter with an aperture diameter of 0.5 μm to obtain a coating solution. Each of the materials, synthesized preparations by the inventors or purchased preparations, was used without further purification.

Light-emitting material:
    1-Bromonaphthalene (produced by Tokyo Kasei, Co.)
Binder polymer:
    Poly(N,N-dimethylaminopropylacrylamide)
    (PDMAPAA, the above-described synthetic product)
Solvent: Methanol (produced by Wako Pure Chemical Industry Co., special grade)

TABLE 3

|  |  | Compounding Amount (mg) |
| --- | --- | --- |
| Light Emitting Material | 1-Bromo-naphthalene | 1 |
| Binder polymer | Poly(N,N-dimethyl-aminopropylacrylamide) | 100 |
| Solvent | Methanol | 9,900 |

Then, the prepared coating solution was coated on the hole transport layer by a spin coating method under the conditions of 3,000 rpm and a coating time of 30 seconds and dried under vacuum at 25° C. for 30 minutes to form a layer containing the light-emitting material and the binder polymer. The obtained layer containing the light-emitting material had a thickness of about 500 nm.

Subsequently, a layer of 3-(4-biphenylyl)-4-phenyl-5-(4-tertiarybutylphenyl)-1,2,4-triazole (TAZ, produced by Dojin Chemical Laboratories) was formed in the same manner as in Example 2 and further formation of cathode and attachment of a lead wire were performed in the same manner as in Example 2 to fabricate an organic EL device.

(2) Evaluation of Light Emission Property

To the organic EL devices described above was applied voltage, and current density and light-emitting luminance were measured. As a result, no light emission was observed with naked eye.

From Example 2 and Comparative Example 2 above, it revealed that intercalating 1-bromonaphthalene in cyclodextrin could give rise to emission of phosphorescence at room temperature.

INDUSTRIAL APPLICABILITY

By using the light-emitting material of the present invention, the energy in the excited triplet state can be efficiently converted into luminescence and a high-luminance organic light-emitting device having durability can be provided.

The invention claimed is:

1. An organic light-emitting device comprising:
a light-emitting layer containing
a light emitting substance which is spatially constricted and confined in an order of two or more dimensions on the level of molecule, wherein the light-emitting substance emits light by electric excitation, and a nucleic acid having a helix structure or a derivative thereof, wherein the nucleic acid or derivative thereof defines a space for constricting and confining the light-emitting substance therein,
and at least one of a hole-transport layer, an electron-transport layer and an electrode layer.

2. The organic light-emitting device as claimed in claim 1, wherein light emission from the light-emitting substance is light emission from an excited triplet state or light emission through an excited triplet state.

3. The light-emitting material device according to claim 1, wherein the nucleic acid is synthetic and is RNA.

4. The light-emitting device as claimed in claim 1 wherein the nucleic acid is DNA.

5. The light-emitting device as claimed in claim 1 wherein the nucleic acid is RNA.

6. The light-emitting device as claimed in claim 1 wherein the nucleic acid is synthetic.

7. A light-emitting material comprising a light-emitting substance spatially constricted and confined in an order of two or more dimensions on the level of molecule, wherein the light-emitting substance emits light by electric excitation, and a nucleic acid having a helix structure or a derivative thereof, wherein the nucleic acid or derivative thereof defines a space for constricting and confining the light-emitting substance therein, and the nucleic acid is a combination of a polydeoxyadenylic acid homopolymer chain and a polydeoxythimidylic acid homopolymer chain.

8. A light-emitting material comprising a light-emitting substance spatially constricted and confined in an order of two or more dimensions on the level of molecule, wherein the light-emitting substance emits light by electric excitation, and a nucleic acid having a helix structure or a derivative thereof, wherein the nucleic acid or derivative thereof defines a space for constricting and confining the light-emitting substance therein, and the nucleic acid is a combination of a polydeoxyadenylic acid homopolymer chain and a polydeoxycytydylic acid homopolymer chain.

* * * * *